United States Patent [19]
Tanigawa et al.

[11] Patent Number: 5,978,026
[45] Date of Patent: Nov. 2, 1999

[54] SOLID-STATE IMAGE PICKUP DEVICE

[75] Inventors: Hiroshi Tanigawa; Hideki Mutoh; Tetsuo Toma; Kazuhiro Kawajiri, all of Kanagawa, Japan

[73] Assignee: Fuji Photo Film Co., Ltd., Kanagawa, Japan

[21] Appl. No.: 08/052,864

[22] Filed: Apr. 28, 1993

Related U.S. Application Data

[63] Continuation of application No. 07/845,270, Mar. 3, 1992, abandoned.

[30] Foreign Application Priority Data

Mar. 7, 1991 [JP] Japan ................................. 3-65207

[51] Int. Cl.$^6$ .................................................... H04N 5/335
[52] U.S. Cl. ............................................ 348/311; 257/216
[58] Field of Search ........................... 257/24, 216, 246; 348/311, 294; 307/221

[56] References Cited

U.S. PATENT DOCUMENTS

| | | | |
|---|---|---|---|
| 3,792,322 | 2/1974 | Boyle et al. | 257/216 |
| 3,924,319 | 12/1975 | Mohsen | 357/24 |
| 4,169,231 | 9/1979 | Nash et al. | 307/221 |
| 4,179,793 | 12/1979 | Hagiwara | 357/24 |
| 4,302,779 | 11/1981 | Inoue | 358/213 |
| 4,686,759 | 8/1987 | Pals et al. | 357/24 |
| 4,891,826 | 1/1990 | Yang | 257/246 |
| 4,907,049 | 3/1990 | Slotboom et al. | 357/24 |
| 4,949,143 | 8/1990 | Iesaka et al. | 357/24 |
| 5,105,450 | 4/1992 | Yamada | 377/58 |

OTHER PUBLICATIONS

Walden et al., "The Buried Channel Charge Coupled Device", B.S.T.J. Brief (Sep. 1972).

*Primary Examiner*—Wendy Garber
*Assistant Examiner*—Andrew B. Christensen
*Attorney, Agent, or Firm*—Sughrue, Mion, Zinn, Macpeak & Seas, PLLC

[57] ABSTRACT

A solid-state image pickup device of the charge-coupled type is improved in that the width W1 (as viewed in the charge transfer direction) of each of the transfer gate electrodes for generating transfer elements in the field shift mode, the width W2 (as viewed in the charge transfer direction) of each of the transfer gate electrode for generating potential barriers also in the field shift mode are selected so as to satisfy the following formula, and a buried channel junction depth $X_{JBC}$ of each of the vertical charge transfer paths are selected so as to satisfy W1>W2 and/or W2>2·$X_{JBC}$. In the inventive image pickup device, the charge quantity transferred is increased without impairing the vertical resolution of the device.

5 Claims, 6 Drawing Sheets

SOLID-STATE IMAGE PICKUP DEVICE

This is a Continuation of application Ser. No. 07/845,270 filed on Mar. 3, 1992, abandoned.

BACKGROUND OF THE INVENTION

The present invention relates to a solid-state image pickup device of the charge-coupled type used for picking up a still picture with a high precision in an interlaced/full-frame scan read mode.

A solid-state image pickup device of the charge-coupled type (referred to also as a CCD) for picking up a still picture in an interlaced/full-frame scan read mode has been proposed in commonly assigned Japanese Patent Applications Nos. Hei-2-178654, 2-178655 and 2-178656. Such an image pickup device is superior to conventional image pickup devices using a four-phase drive system in that it suffers little smearing and can provide an improved vertical resolution.

Figure 1:
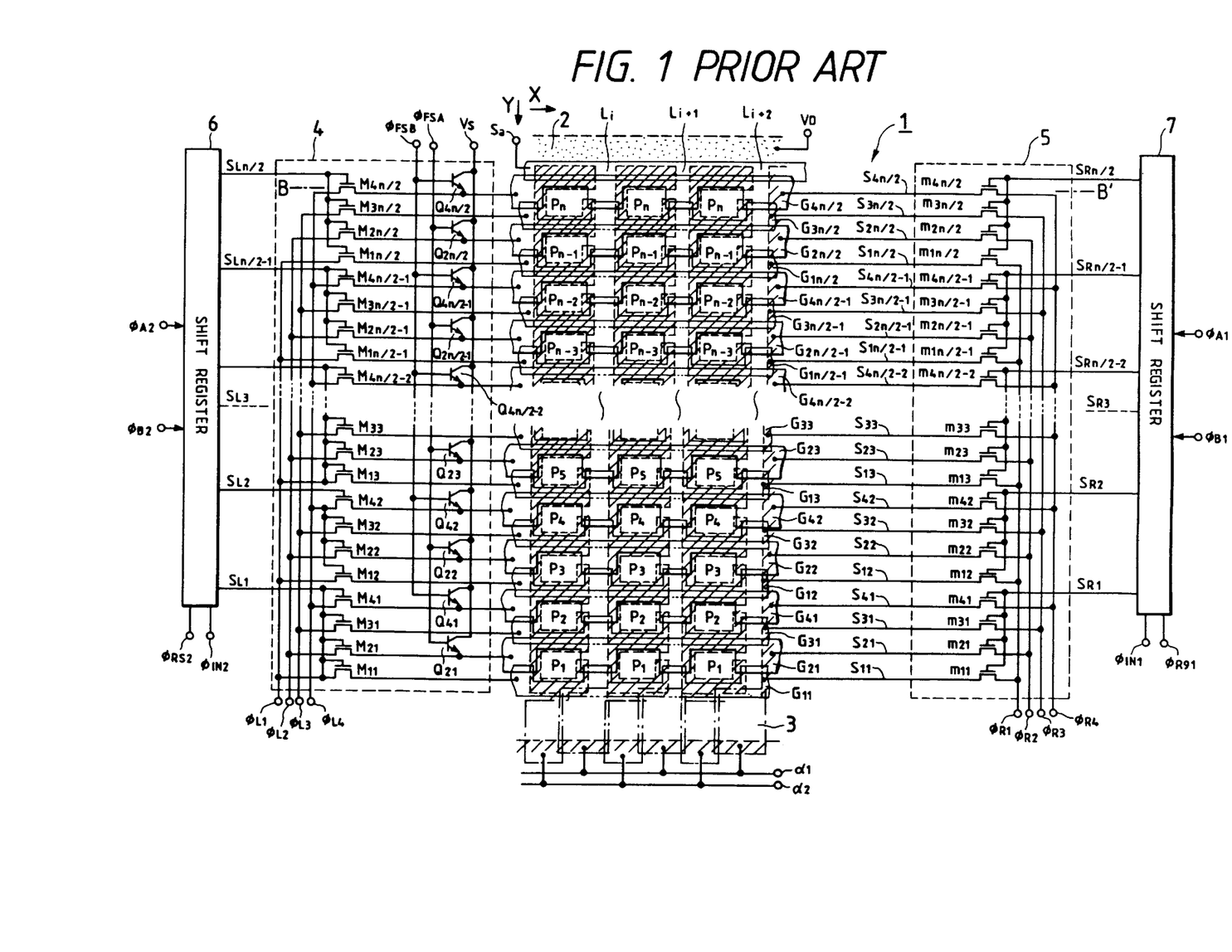
FIG. 1 is a diagram showing the construction of a conventional solid-state image pickup device of the charge-coupled type.

An example of a conventional image pickup device will be described with reference to FIGS. 1 and 2. As shown in FIG. 1, the image pickup device, which is formed by IC fabricating techniques, includes layers having a proper concentration of an impurity material buried in a semiconductor substrate, and electrode layers, for example, disposed on the substrate.

A light-receiving portion 1 is formed as follows: In a p-well layer (not shown) in a semiconductor substrate, a plurality of layers formed by an $n^+$ impurity are buried in a column (Y) direction and a row (X) direction, thereby to form an n×m matrix array of photodiodes (denoted as P1 to Pn for each column). Layers of an n-type impurity are buried adjacent to and alongside respective linear arrays of photodiodes, which extend in the column (Y) direction. Further, transfer gate electrodes (to be described in more detail below) are layered on the n-type impurity layers. With this structure, vertical charge transfer paths $L_1$ to $L_m$ are formed (only vertical charge transfer paths $L_1$, $L_{1+1}$, and $L_{1+2}$ are shown for ease of illustration).

A drain portion 2, which is composed of an n-type impurity at a high concentration and is employed for discharging unwanted charge, is buried in the top end portion of the vertical charge transfer paths (as viewed in the drawing). A horizontal charge transfer path 3, which is employed for transferring charge in synchronism with drive signals α1 and α2 in a two- or four-phase drive mode, is formed in the bottom end portion of the vertical charge transfer paths.

In these vertical charge transfer paths, as shown, pairs of transfer gate electrodes $G_{11}$, $G_{21}$, $G_{31}$, $G_{41}$, $G_{12}$, $G_{22}$, $G_{32}$, $G_{42}$, to $G_{1n/2}$, $G_{2n/2}$, $G_{3n/2}$, and $G_{4n/2}$ are respectively provided for the photodiodes of the columns. Since in the Y or column direction the photodiodes P1 to Pn are provided for each n number of columns, the total number of transfer gate electrodes is 2×n.

Channel stoppers are formed in portions of the structure (shaded portions enclosed by dotted lines) except portions which serve as transfer gates denoted as Tg (only one portion being illustrated), the portions of the photodiodes, the portions of the vertical charge transfer paths, and the portions of the horizontal charge transfer paths.

The transfer gate electrodes $G_{11}$, $G_{21}$, $G_{31}$, $G_{41}$, to $G_{1n/2}$, $G_{2n/2}$, $G_{3n/2}$, and $G_{4n/2}$ transfer pixel signals in synchronism with drive signals of prescribed timing, which are supplied from a first drive circuit 4, a second drive circuit 5, and shift registers 6 and 7.

In the image pickup device, for purposes of control, the transfer gate electrodes are divided into sets, each composed of four transfer gate electrodes, with respect to the transfer gate electrode $G_{11}$ located closest to the horizontal charge transfer path 3.

In the first drive circuit 4, the first set of transfer gate electrodes $G_{11}$, $G_{12}$, $G_{13}$, $G_{14}$ to $G_{1n/2}$ are connected to a signal line of a timing signal $\phi_{L1}$, through NMOS transistors $M_{11}$, $M_{12}$, $M_{13}$, to $M_{14}$ to $M_{1n/2}$. The second set of transfer gate electrodes $G_{21}$, $G_{22}$, $G_{23}$, $G_{24}$ to $G_{2n/2}$ are connected to a signal line of a timing signal $\phi_{L2}$ through NMOS transistors $M_{21}$, $M_{22}$, $M_{23}$, $M_{24}$ to $M_{2n/2}$. The third set of transfer gate electrodes $G_{31}$, $G_{32}$, $G_{33}$, $G_{34}$ to $G_{3n/2}$ are connected to a signal line of a timing signal $\phi_{L3}$ through NMOS transistors $M_{31}$, $M_{32}$, $M_{33}$, $M_{34}$ to $M_{3n/2}$. The third set of transfer gate electrodes $G_{41}$, $G_{42}$, $G_{43}$, $G_{44}$ to $G_{4n/2}$ are connected to a signal line of a timing signal $\phi_{L4}$ through NMOS transistors $M_{41}$, $M_{42}$, $M_{43}$, $M_{44}$ to $M_{4n/2}$. The output signals $S_{L1}$ to $S_{Ln/2}$ of the shift register 6 are applied to the gate electrodes of the quartets of NMOS transistors.

The second set of transfer gate electrodes $G_{21}$, $G_{22}$, $G_{23}$, $G_{24}$ to $G_{2n/2}$ are connected to the emitters of npn transistors $Q_{21}$, $Q_{22}$, $Q_{23}$, $Q_{24}$ to $Q_{2n/2}$, the bases of which are connected to a signal $\phi_{FSA}$. The fourth set of transfer gate electrodes $G_{41}$, $G_{42}$, $G_{43}$, $G_{44}$ to $G_{4n/2}$ are connected to the emitters of npn transistors $Q_{41}$, $Q_{42}$, $Q_{43}$, $Q_{44}$ to $Q_{4n/2}$, the bases of which are connected to a signal $\phi_{FSB}$. Voltage Vs is applied to the collectors of all of the npn transistors.

The second drive circuit 5 is composed of 2×n NMOS transistors $m_{11}$, $m_{21}$, $m_{31}$, $m_{41}$ to $m_{1n/2}$, $m_{2n/2}$, $m_{3n/2}$, and $m_{4n/2}$, which are switched in synchronism with the signals $S_{R1}$, $S_{R2}$, $S_{R3}$ to $S_{Rn/2}$ derived from the shift register 7.

These NMOS transistors are divided into sets each of a quartet of transistors with respect to the NMOS transistor $m_{11}$ closest to the horizontal charge transfer path 3. Drive signals $S_{R1}$, $S_{R2}$, $S_{R3}$ to $S_{Rn/2}$, derived from the shift register 7, are sequentially applied to the gate electrodes of those sets of transistors.

Next, the operation of the CCD when it picks up a still image will be described with reference to FIG. 2. In the image pickup mode, the timing signals $\phi_{L1}$ and $\phi_{L3}$ are set to the "L" level and the timing signals $\phi_{L2}$ and $\phi_{L4}$ are set to the "M" level.

Figure 2:
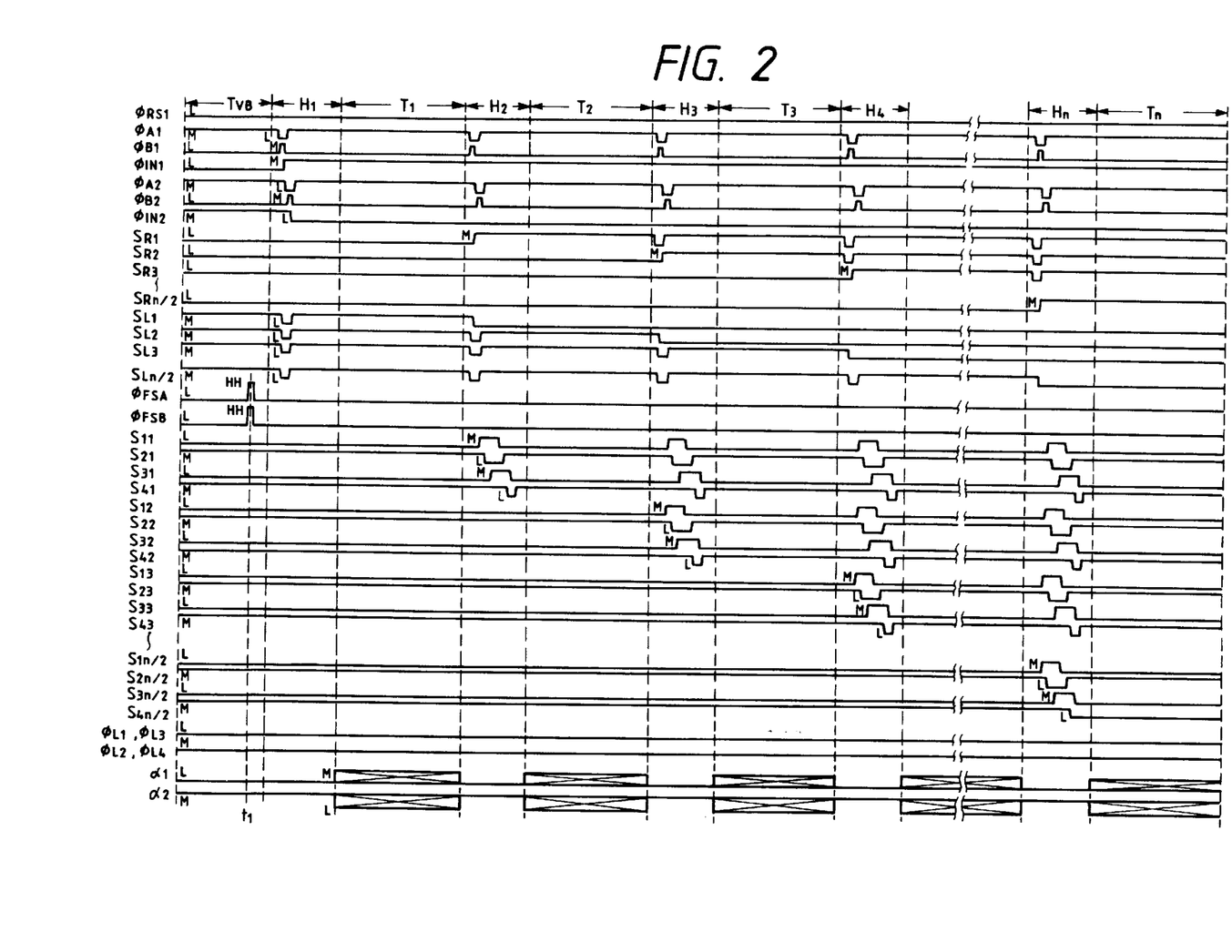
FIG. 2 is a timing charge used in explaining the operation of the conventional image pickup device of FIG. 1.

In FIG. 2, at a time point of starting the vertical blanking period $T_{VB}$, the output signals $S_{R1}$ to $S_{Rn/2}$ of the shift register 7 are initialized to the "L" level, and the output signals $S_{L1}$ to $S_{Ln/2}$ of the shift register 6 are also initialized to the "L" level.

At a time point t1 during the vertical blanking period $T_{VB}$, both the signals $\phi_{FSA}$ and $\phi_{FSB}$ are simultaneously set to "HH" levels, thereby to start a field shift operation. At the instant that the signals $\phi_{FSA}$ and $\phi_{FSB}$ are simultaneously set to "HH" levels, all of the npn transistors $Q_{21}$, $Q_{41}$ to $Q_{2n/2}$, $Q_{4n/2}$ become conductive. All of the pixel signals are then shifted to the transfer elements under the even-numbered transfer gate electrode pairs $G_{21}$, $G_{41}$, $G_{22}$, $G_{42}$ to $G_{2n/2}$, $G_{4n/2}$ in the light-receiving portion 1.

The odd-numbered transfer gate electrode pairs $G_{11}$, $G_{31}$, $G_{12}$, $G_{32}$ to $G_{1n/2}$, $G_{3n/2}$ are set to the "L" level by the timing signals $\phi_{L1}$ and $\phi_{L3}$. To avoid mixing of the adjacent pixel signals, potential barriers are generated in the vertical charge transfer paths L1 to Ln.

Since the output signals $S_{R1}$ to $S_{Rn/2}$ of the shift register 7 are at the "L" level at time point t1, as stated above, the NMOS transistors $m_{11}$ to $m_{4n/2}$ in the second drive circuit 5 are all turned off. Accordingly, the second drive circuit 5 and all of the transfer gate electrodes $G_{11}$ to $G_{4n/2}$ are in an off-state. The transfer gate electrodes $G_{11}$ to $G_{4n/2}$ are controlled by only the signal from the first drive circuit 4.

When the vertical blanking period $T_{VB}$ terminates, the shift register 7 applies a start signal $\phi_{IN1}$ of "M" level in synchronism with shift drive signals $\phi_{A1}$ and $\phi_{B1}$ during a horizontal blanking period H1. At the same time, the shift register 6 applies a start signal $\phi_{IN2}$ of "L" level in synchronism with shift drive signals $\phi_{A2}$ and $\phi_{B2}$.

Then, during a horizontal scan period T1, the horizontal charge transfer path 3 horizontally transfers unwanted charge to the outside in synchronism with the timing signal $\alpha1$ and $\alpha2$.

During the first half of the horizontal blanking period H2, the shift register 7 operates in synchronism with the shift signals $\phi_{A1}$ and $\phi_{B1}$, so that the output signal $S_{R1}$ is at the "M" level and the remaining output signals $S_{R2}$ to $S_{Rn/2}$ are left at the "L" level. The shift register 6 operates in synchronism with the shift signals $\phi_{A2}$ and $\phi_{B2}$, so that the output signal $S_{L1}$ is at the "L" level and the remaining output signals $S_{L2}$ to $S_{Ln/2}$ are left at the "H" level.

Under this condition, the timing signals $\phi_{R1}$, $\phi_{R2}$, $\phi_{R3}$, and $\phi_{R4}$ are applied to the second drive circuit 5. Only the drive signals $S_{11}$, $S_{21}$, $S_{31}$, and $S_{41}$ are applied to the first set of transfer gate electrodes $G_{11}$, $G_{21}$, $G_{31}$, and $G_{41}$ at the same timings as the respective timing signals $\phi_{R1}$, $\phi_{R2}$, $\phi_{R3}$, and $\phi_{R4}$. The pixel signals, which correspond to the first set of the transfer gate electrodes (the pixel signals of the rows or lines of diodes P1 and P2), are transferred by one line of pixel signals toward the horizontal charge transfer path 3. The pixel signals of the line of the diodes P1 alone are transferred to the horizontal charge transfer path 3.

During the horizontal scan period T2, the horizontal charge transfer path 3 performs the horizontal transfer in synchronism with timing signals $\alpha1$ and $\alpha2$, so that the pixel signals of the first line (of the diodes P1) are read out in a dot-sequential order.

During the first half of a horizontal blanking period H3, the shift register 7 performs its shift operation in synchronism with the shift drive signals $\phi_{A1}$ and $\phi_{B1}$, so that the first and second output signals $S_{R1}$ and $S_{R2}$ are at the "M" level, and the remaining output signals $S_{R3}$ to $S_{Rn/2}$ are left at the "L" level. The shift register 6 performs the shift operation in synchronism with the shift drive signals $\phi_{A2}$ and $\phi_{B2}$, so that the first and second output signals $S_{L1}$ and $S_{L2}$ are at the "L" level, and the remaining output signals $S_{L3}$ to $S_{Ln/2}$ are left at the "H" level.

Under this condition, the timing signals $\phi_{R1}$, $\phi_{R2}$, $\phi_{R3}$, and $\phi_{R4}$ are applied to the second drive circuit 5. Only the drive signals $S_{11}$, $S_{21}$, $S_{31}$, $S_{41}$, $S_{12}$, $S_{22}$, $S_{32}$, and $S_{42}$ are applied to the first and second sets of transfer gate electrodes $G_{11}$, $G_{21}$, $G_{31}$, $G_{41}$, $G_{12}$, $G_{22}$, $G_{32}$, and $G_{42}$ at the same timings as the timing signals $\phi_{R1}$, $\phi_{R2}$, $\phi_{R3}$, and $\phi_{R4}$. The pixel signals which correspond to the line of the diodes P2 and the second set of the transfer gate electrodes (the lines of the diodes P3 and P4) are transferred toward the horizontal charge transfer path 3. The pixel signals of only the line of the diodes P2 are transferred to the horizontal charge transfer path 3. Only the pixel signals of the line of the diodes P1 are transferred to the horizontal charge transfer path 3.

Then, during the horizontal scan period T2, the horizontal charge transfer path 3 performs the horizontal transfer in synchronism with the timing signals $\alpha1$ and $\alpha2$, so that the pixel signals of the first line (of the diodes P1) are read out in a dot-sequential order.

During the next horizontal scan period T3, the horizontal charge transfer path 3 performs the horizontal transfer in synchronism with the timing signals $\alpha1$ and $\alpha2$, so that the pixel signals of the second line (of the diodes P2) are read out in a dot-sequential order.

Thus, every horizontal blanking period, the shift register 7 performs the shift operation to successively invert the output signals $S_{R1}$ to $S_{Rn/2}$ from the "L" level to the "M" level. At the same time, the shift register 6 performs the shift operation every horizontal blanking period to successively invert the output signals $S_{R1}$ to $S_{Rn/2}$ from the "M" level to the "L" level. In this way, the drive range of the transfer gate electrodes by the timing signals $\phi_{R1}$, $\phi_{R2}$, $\phi_{R3}$, and $\phi_{R4}$ is gradually expanded. This is continued until all of the pixel signals have been read out.

In the drive system constructed as described above, the vertical charge transfer paths L1 to Lm perform the charge transfer operations in order from the pixel signals closer to the horizontal charge transfer path 3 in successive order in a "domino" fashion. Accordingly, the drive system can read pixel signals in the noninterlaced/full-frame scan read mode using a smaller number of the transfer gates than required for the conventional four-phase drive system. The smear inherent to field scanning be remarkably reduced. Further, the vertical resolution can be improved by the reduced number of transfer gate electrodes.

Figure 3:
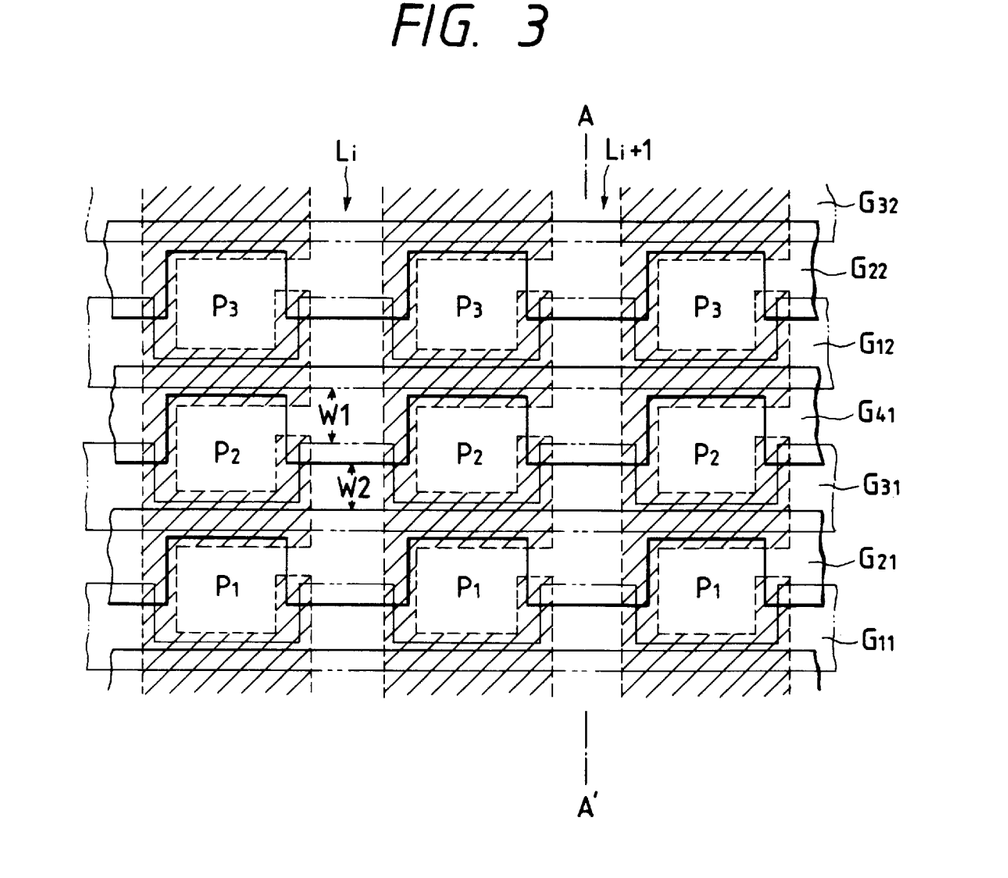
FIG. 3 is a plan view showing a part of a key portion of the image pickup device of FIG. 1.
Figure 4:
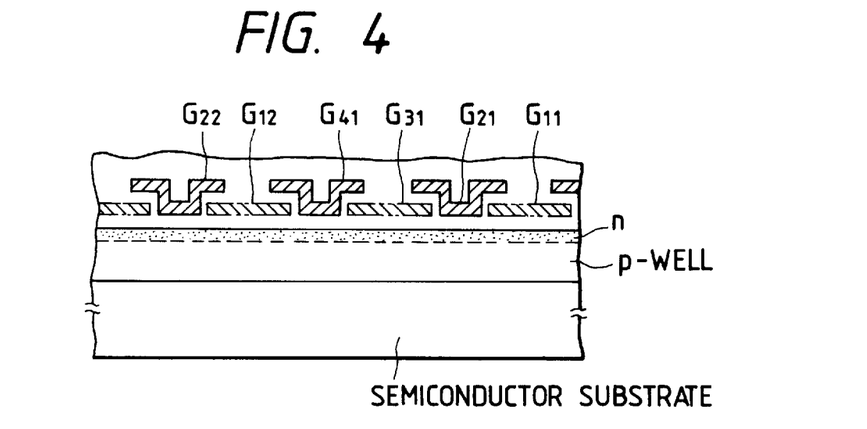
FIG. 4 is a sectional view taken on a line A-A' in FIG. 3.

In the conventional CCD as described above, as shown in FIG. 3 illustrating an enlarged view of a key portion of the CCD and FIG. 4 illustrating a cross section thereof, the widths (as viewed in the charge transfer direction) of the transfer gate electrodes $G_{11}$ to $G_{4n/2}$ for generating the potential barriers and the transfer elements for retaining the pixel signals in the vertical charge transfer paths are designed to be substantially equal to each other. In the field shift mode, transfer elements are alternately generated under those transfer gates (the gates $G_{21}$, $G_{41}$, and $G_{22}$ typically illustrated in FIG. 4). At the same time, a potential barrier is generated under the remaining gate electrodes (only the gates $G_{11}$, $G_{31}$, and $G_{12}$ and $G_{32}$ typically illustrated in FIG. 4). The pixel signals of all of the diodes are field shifted to the transfer elements every line of pixel signals in successive order, as mentioned above.

Thus, in the CCD, one pair of transfer gate electrodes retains and transfers one pixel signal. Accordingly, the efficiency of charge transfer is good, but the charge quantity of each pixel signal for each pixel is not large, thereby restricting the dynamic range improvement. The known four-phase drive system transfers one pixel signal using a plural number of transfer gate electrodes. Accordingly, the quantity of charge to be transferred may be increased, but this inhibits the use of a high-precision scan read, such as the noninterlaced/full-frame read. In this respect, development of a new means solving the above problems has been required.

SUMMARY OF THE INVENTION

The present invention has been made in view of the above circumstances, and has as an object the provision of a solid-state image pickup device of the charge-coupled type which can increase the quantity of charge transferred without impairing the vertical resolution.

Another object of the present invention is to provide a solid-state image pickup device of the charge-coupled type which can reliably generate potential barriers, thereby preventing a pixel signal of one transfer element from being mixed with the pixel signals of the transfer elements adjacent to the former.

In accordance with the present invention, in order to achieve the above and other objects, a solid-state image pickup device of the charge-coupled type including a light-receiving portion in which a plurality of optoelectric transducing elements corresponding to pixels are vertically and horizontally arrayed in a matrix fashion, vertical charge transfer paths are provided adjacent to respective ones of the optoelectric transducing elements of the vertical linear array in such a state that the transfer gates are disposed therebetween, and the transfer gate electrodes for the vertical charge transfer paths are formed in such a manner that the transfer gate electrodes are paired and a pair of the transfer gate electrodes is provided for the respective linear array of the optoelectric transducing elements.

In picking up a still picture, transfer elements and potential barriers are alternately generated in the array order of the array of the transfer gate electrodes for the vertical charge transfer paths, all of the pixel signals generated in the optoelectric transducing elements are field shifted to the respective transfer elements through the transfer gates, the transfer gate electrodes are divided into sets each of a preset number of transfer gate electrodes, transfer gate signals at prescribed timings are successively applied to the sets of transfer gate electrodes in order from the set of transfer gate electrodes located closest to a horizontal charge transfer path, the pixel signals of the sets of transfer gate electrodes are transferred to the horizontal charge transfer path in order from the set of transfer gate electrodes located closest to a horizontal charge transfer path, and by repeating an operation to time sequentially read pixel signals through the horizontal charge transfer operation every time each horizontal charge transfer path receives the pixel signal, the pixel signals are read in an interlaced/full-frame scan mode. In accordance with the invention, the above solid-state image pickup device is improved in that the width W1 (as viewed in the charge transfer direction) of each of the transfer gate electrodes for generating transfer elements in the field shift mode, and the width W2 (as viewed in the charge transfer direction) of each of the transfer gate electrodes for generating potential barriers also in the field shift mode, are selected so as to satisfy:

$$W1 >> W2.$$

With such an improvement, the transfer element for retaining and transferring the pixel signal may be formed to have a size larger than that of the potential barrier. Accordingly, the quantity of the transferred charge may be increased beyond that in the conventional image pickup device. As a result, an improvement of the dynamic range and a reduction in the amount of smearing can be realized, providing a clear and high quality reproduced picture.

In the solid-state image pickup device of the charge-coupled type, the width W2 of each of the transfer gate electrodes and a buried channel junction depth $X_{JBC}$ of each of the vertical charge transfer paths are selected so as to satisfy:

$$W2 > 2 \cdot X_{JBC}$$

Thus, the minimum width (W2) of each of the transfer gate electrodes for generating the potential barriers is selected to be more than twice as long as the buried channel junction depth $X_{JBC}$. Therefore, the potential barriers can be reliably generated, and hence the picture elements will not be mixed between the transfer elements.

BRIEF DESCRIPTION OF THE DRAWINGS

The accompanying drawings, which are incorporated in and constitute a part of this application illustrate preferred embodiments of the invention and, together with the accompanying description, serve to explain the objects, advantages and principles of the invention. In the drawings.

DESCRIPTION OF THE PREFERRED EMBODIMENTS

A preferred embodiment of the present invention will be described with reference to the accompanying drawings.

Figure 5:
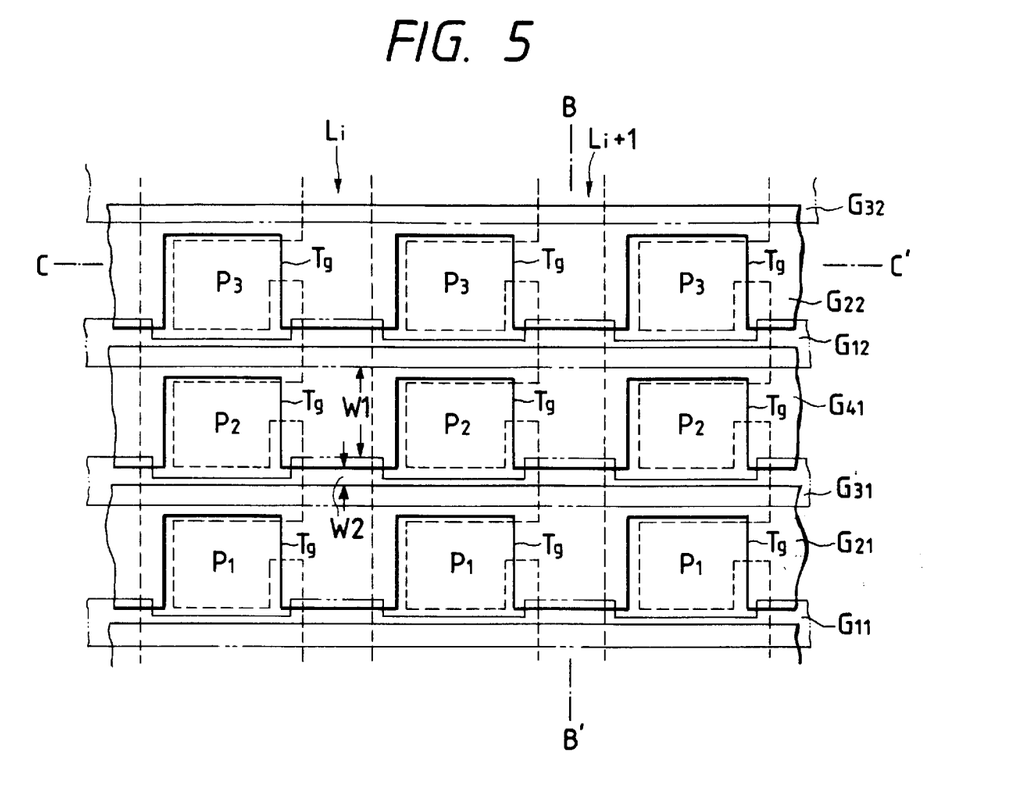
FIG. 5 is a plan view showing a part of a key portion of an image pickup device constructed according to a preferred embodiment of the present invention.
Figure 6:
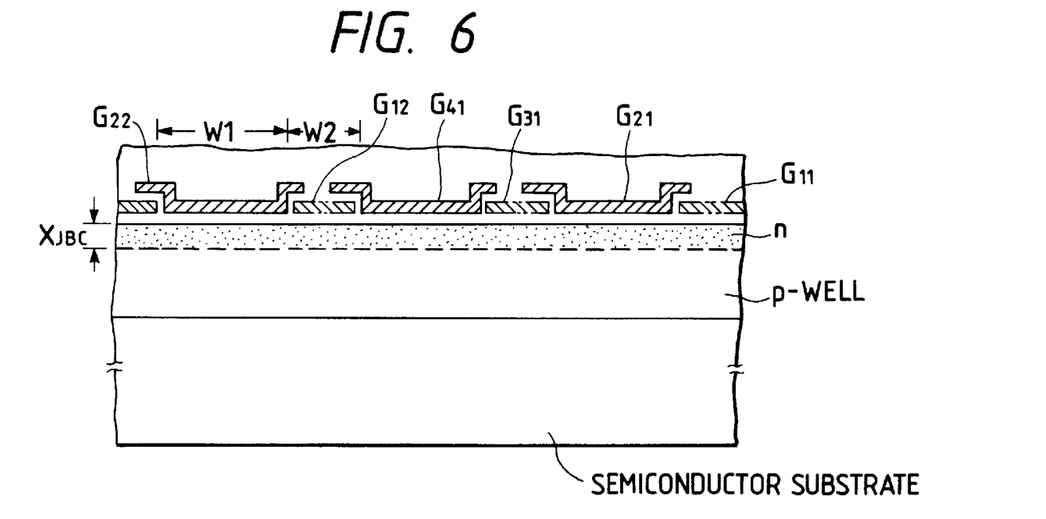
FIG. 6 is a cross sectional view taken on a line B-B' in FIG. 5.
Figure 7:
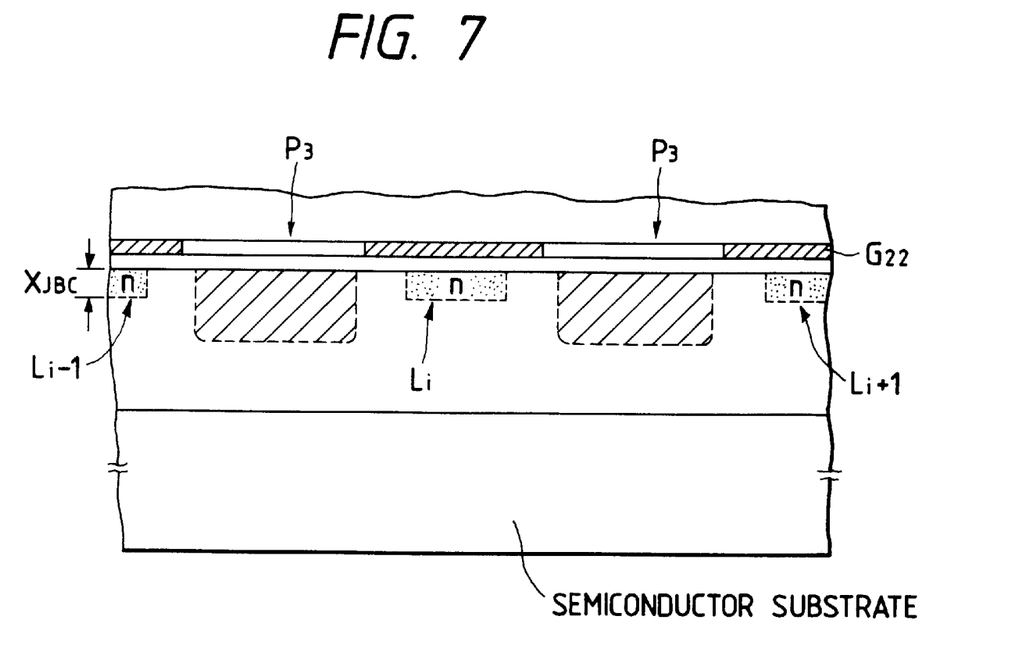
FIG. 7 is a cross sectional view taken on a line C-C' in FIG. 5.
Figure 8:
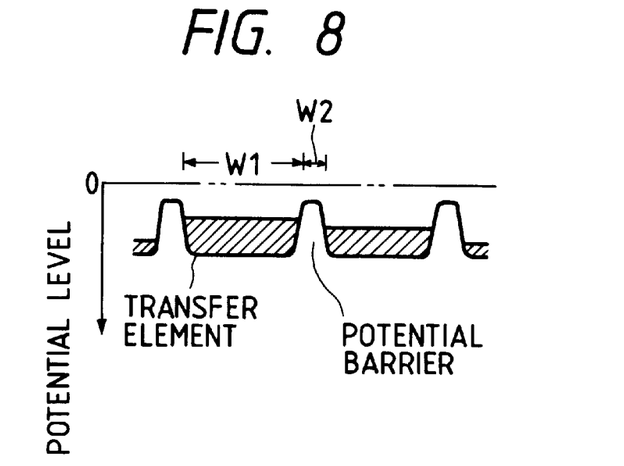
FIG. 8 is an explanatory diagram used in explaining a potential state on the vertical charge transfer path.

A solid-state image pickup device of the charge-coupled type according to the preferred embodiment of the invention is similar to that shown in FIGS. 1 and 2 in the construction and operation. The major differences of the image pickup device from the conventional image pickup device shown in FIGS. 1, 3 and 4 will be described with reference to FIGS. 5 to 10. In FIG. 5, w1 designates the width of each of the even-numbered transfer gate electrodes $G_{21}$, $G_{41}$, $G_{22}$, to $G_{2n/2}$ as viewed in the charge transfer direction. These gate electrodes are employed for generating the transfer elements (potential wells), and are each adjacent to the photodiode with the transfer gate Tg disposed therebetween. W2 indicates the width of each of the odd-numbered transfer gate electrodes $G_{11}$, $G_{31}$, $G_{12}$, $G_{32}$ to $G_{3n/2}$ as viewed in the charge transfer direction. These gate electrodes are located between adjacent ones of the even-numbered gate electrodes. In the present invention, the ratio W1/W2 of the widths W1 and W2 is selected to be as large as possible. Further, the width W2 is selected to be more than twice as long as a buried channel junction depth $X_{JBC}$ of an "n" impurity layer, which is buried in the well layer to form the vertical charge transfer paths. Those conditions may be mathematically expressed by $$W2 > 2 \cdot X_{JBC} \text{ and } W1 >> W2.$$

With the image pickup device operated according to the timing chart shown in FIG. 2, the transfer elements are generated under the transfer gate electrodes formed so as to have the broad width W1 as shown in FIG. 5, potential barriers are generated under the transfer gate electrodes formed so as to have the narrow width W2. The signals of the pixels are field shifted to the transfer elements.

Figure 9:
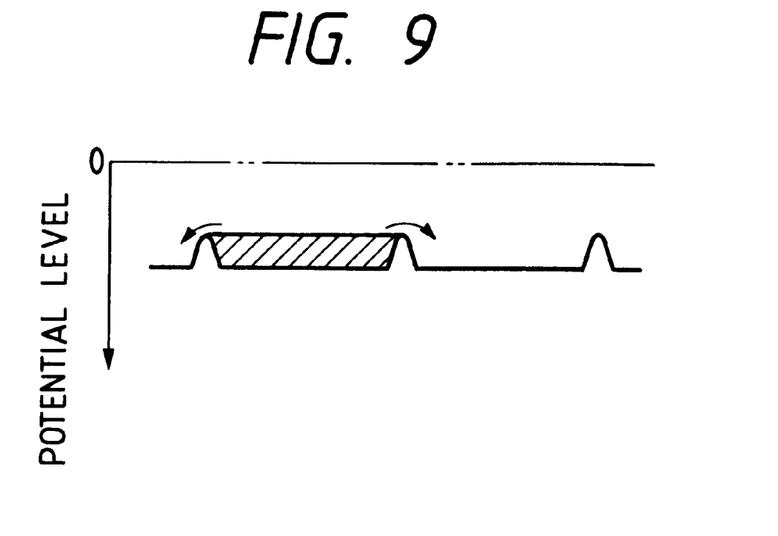
FIG. 9 is an explanatory diagram used in explaining another potential state on the vertical charge transfer path.
Figure 10:
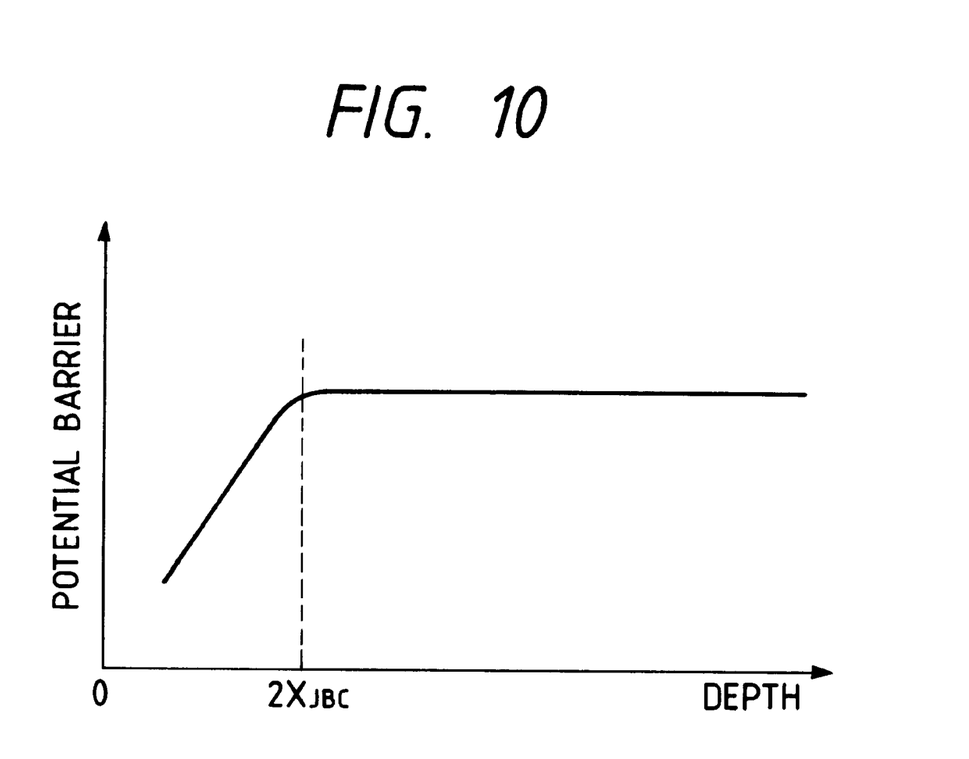
FIG. 10 is a graph showing a variation of the potential barrier with respect to the buried channel junction depth, the illustration being for the purposes of explaining the relationship of the width of the transfer gate electrode and the potential barrier level.

Since the width W2 is set to be W2>2·$X_{JBC}$, the potential barrier generated is high enough to separate the adjacent transfer elements. When the potential barrier generated is unsatisfactory in level as shown in FIG. 9, the pixel signals in the adjacent transfer elements will be mixed with each other. The present invention, however, successfully solves the problem of the mixing of the pixel signals. The potential barrier, as shown in FIG. 10, falls in the region where the width is below 2·$X_{JBC}$, and is saturated at a fixed level when it exceeds the 2·$X_{JBC}$. Therefore, by selecting the width W2 to be W2>2·$X_{JBC}$, the reliable generation of the potential barrier can be guaranteed.

Thus, the image pickup device of the present embodiment can increase the quantity of the transferred charge, with a relatively simple construction, thereby to effect noninterlaced/full-frame scan reading. Accordingly, the invention can realize an improvement of dynamic range and a reduction of noise without impairing the vertical resolution.

As described above, in the solid-state image pickup device of the charge-coupled type according to the present invention, the transfer gate electrodes for generating transfer elements, which are used for retaining and transferring pixel signals, are formed to have broad widths, while the transfer gate electrodes for generating potential barriers are formed to have narrow widths. Therefore, the quantity of charge transferred can be increased beyond that of the conventional image pickup device, leading to an improvement of dynamic range and reduction of noise component. The minimum width of each of the transfer gate electrode for generating the potential barrier is selected to be more than two times as long as the buried channel junction depth of the buried layer used for forming the vertical charge transfer paths. Therefore, reliable generation of the potential well is guaranteed, and no reduction of the charge transfer efficiency is caused.

The foregoing description of a preferred embodiment of the invention has been provided for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. In a solid-state image pickup device of the charge-coupled type including a light-receiving portion in which a plurality of optoelectric transducing elements corresponding to pixels are vertically and horizontally arrayed in a matrix fashion, vertical charge transfer paths are located adjacent to respective ones of the optoelectric transducing elements of the vertical linear array with transfer gates disposed therebetween, and the transfer gate electrodes for the vertical charge transfer paths are formed such that the transfer gate electrodes are paired and each pair of the transfer gate electrodes is arranged for the linear array of the optoelectric transducing elements, wherein, in picking up a still picture, transfer elements and potential barriers are alternately generated in the arraying order of the array of the transfer gate electrodes for the vertical charge transfer paths, all of the pixel signals generated in the optoelectric transducing elements are respectively field shifted to the transfer elements through the transfer gates, the transfer gate electrodes are divided into sets each of a preset number of transfer gate electrodes, transfer gate signals at prescribed timings are successively applied to the sets of transfer gate electrodes in order from the set of transfer gate electrodes located closest to a horizontal charge transfer path, the pixel signals of the sets of transfer gate electrodes are transferred to the horizontal charge transfer path in the order from the set of transfer gate electrodes located closest to a horizontal charge transfer path, and by repeating an operation to time sequentially read pixel signals through the horizontal charge transfer operation every time each horizontal charge transfer path receives the pixel signal, the pixel signals are read in an interlaced/full-frame scan mode, the improvement wherein the width W1 as viewed in a charge transfer direction, of each of the transfer gate electrodes for generating transfer elements in the field shift mode, and the width W2, as viewed in the charge transfer direction, of each of the transfer gate electrodes for generating potential barriers also in the field shift mode are selected so as to satisfy W1>>W2 for adjacent transfer gate electrodes.

2. In a solid-state image pickup device of the charge-coupled type including a light-receiving portion in which a plurality of optoelectric transducing elements corresponding to pixels are vertically and horizontally arrayed in a matrix fashion, vertical charge transfer paths are located adjacent to respective ones of the optoelectric transducing elements of the vertical linear array with transfer gates disposed therebetween, and the transfer gate electrodes for the vertical charge transfer paths are formed such that the transfer gate electrodes are paired and each pair of the transfer gate electrodes is arranged for the linear array of the optoelectric transducing elements, wherein, in picking up a still picture, transfer elements and potential barriers are alternately generated in the arraying order of the array of the transfer gate electrodes for the vertical charge transfer paths, all of the pixel signals generated in the optoelectric transducing elements are respectively field shifted to the transfer elements through the transfer gates, the transfer gate electrodes are divided into sets each of a preset number of transfer gate electrodes, transfer gate signals at prescribed timings are successively applied to the sets of transfer gate electrodes in order from the set of transfer gate electrodes located closest to a horizontal charge transfer path, the pixel signals of the sets of transfer gate electrodes are transferred to the horizontal charge transfer path in the order from the set of transfer gate electrodes located closest to a horizontal charge transfer path, and by repeating an operation to time sequentially read pixel signals through the horizontal charge transfer operation every time each horizontal charge transfer path receives the pixel signal, the pixel signals are read in an interlaced/full-frame scan mode, the improvement in which the width W1, as viewed in the charge transfer direction, of each of the transfer gate electrodes for generating transfer elements in the field shift mode, the width W2, as viewed in the charge transfer direction, of each of the transfer gate electrodes for generating potential barriers also in the field shift mode, and a buried channel junction depth $X_{JBC}$ of each of the vertical charge transfer paths are selected so as to satisfy W1>W2 for adjacent transfer gate electrodes and W2>2·$X_{JBC}$.

3. In a solid-state image pickup device as defined by claim 2, wherein W2>2·$X_{JBC}$ such that said potential barriers are generated so as to separate adjacent transfer elements, and to prevent said picture elements from being mixed between said adjacent transfer elements.

4. In a solid-state image pickup device as defined by claim 2, wherein said present number of transfer gate electrodes comprises four transfer gate electrodes.

5. In a solid-state image pickup device as defined by claim 2, wherein $W_1 >> W_2$ such that said transfer elements for retaining and transferring pixel signals are formed to be larger than said potential barriers.

* * * * *